United States Patent
Park (10) Patent No.: US 8,550,032 B2
(45) Date of Patent: Oct. 8, 2013

(54) MASK ASSEMBLY FOR THIN FILM DEPOSITION OF FLAT PANEL DISPLAY

(75) Inventor: Jae-Seok Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 353 days.

(21) Appl. No.: 12/971,948

(22) Filed: Dec. 17, 2010

(65) Prior Publication Data
US 2011/0146573 A1 Jun. 23, 2011

(30) Foreign Application Priority Data
Dec. 17, 2009 (KR) .................. 10-2009-0126210

(51) Int. Cl.
*B05C 11/11* (2006.01)
*B05D 5/00* (2006.01)

(52) U.S. Cl.
USPC ........................................ 118/504; 427/282

(58) Field of Classification Search
None
See application file for complete search history.

(56) References Cited

U.S. PATENT DOCUMENTS

| | | |
|---|---|---|
| 2004/0202821 A1 | 10/2004 | Kim et al. |
| 2005/0019968 A1 | 1/2005 | Kuwahara et al. |

FOREIGN PATENT DOCUMENTS

| | | |
|---|---|---|
| JP | 2004335382 | 11/2004 |
| JP | 2007291461 A * | 11/2007 |
| KR | 10-2003-0084556 A | 11/2003 |
| KR | 10-2006-0080479 A | 7/2006 |
| KR | 10-2006-0123946 A | 12/2006 |
| KR | 10-2008-0058602 A | 6/2008 |
| KR | 1020090053417 | 5/2009 |
| KR | 10-2009-0059225 A | 6/2009 |
| KR | 10-0903624 B1 | 6/2009 |

OTHER PUBLICATIONS

Sung et al, KR 1020090053417, English translation.*

* cited by examiner

*Primary Examiner* — Dah-Wei Yuan
*Assistant Examiner* — Charles Capozzi
(74) *Attorney, Agent, or Firm* — Robert E. Bushnell, Esq.

(57) ABSTRACT

A described technology relates generally to a thin-film deposition mask assembly of a flat panel display for correcting form distortion caused by tension of a division mask. The thin-film deposition mask assembly includes: a frame for forming a penetrated opening; a first change compensating member and a second change compensating member disposed across the opening, fixed to a free end member formed by partially cutting the frame from the opening, and arranged as a pair; and a plurality of division masks being disposed to cross the first change compensating member and the second change compensating member on top sides of the first change compensating member and the second change compensating member.

8 Claims, 8 Drawing Sheets

MASK ASSEMBLY FOR THIN FILM DEPOSITION OF FLAT PANEL DISPLAY

RELATED APPLICATIONS

This application claims priority to and the benefit of Korean Patent Application No. 10-2009-0126210 filed in the Korean Intellectual Property Office on Dec. 17, 2009, the entire contents of which are incorporated herein by reference.

BACKGROUND OF THE INVENTION

1. Field of the Invention

The described technology relates generally to a thin-film deposition mask assembly of a flat panel display. More particularly, the described technology relates generally to a thin-film deposition mask assembly of a flat panel display for attaching a division mask in a mask frame.

2. Description of the Related Art

Conventionally, flat panel displays include organic light emitting displays, liquid crystal displays (LCD), and plasma display panels (PDP). Manufacturing of an organic light emitting diode (OLED) display includes a process for forming an electrode and an organic emission layer with a thin film of a specific pattern. A mask assembly is used for the thin-film deposition process.

For example, the mask assembly includes a mask frame forming an opening, belt-type division masks fixed to the mask frame while tension is applied thereto in the length direction, and sub-masks intercepting neighboring division masks. The division mask includes a plurality of pattern openings to manufacture a plurality of organic light emitting diode (OLED) displays on a substrate array. Each pattern opening corresponds to one organic light emitting diode (OLED) display, and it is formed in the same pattern as the electrode or organic emission layer to be formed on the organic light emitting diode (OLED) display.

As the mask assembly has been enlarged, the length of the division mask has also been increased. Hence, the division mask is increased to remain behind because of gravity, and it becomes difficult to align the division mask and the mask frame, and the mask assembly and the substrate array. To reduce the division mask's to such remaining, tension is applied to the division mask. Therefore, tension is substantially applied to both sides of the frame, and the mask frame is bent inwardly in the tension's vertical direction. That is, a form distortion, such as, a saddle type of distortion occurs in the mask assembly. The form distortion of the mask assembly generates a position error of the pattern from the pattern opening of the division mask, and further increases the error.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a thin-film deposition mask assembly of a flat panel display for correcting form distortion caused by tension of a division mask.

An exemplary embodiment provides a thin-film deposition mask assembly of a flat panel display including: a frame for forming a penetrated opening; a first change compensating member and a second change compensating member disposed across the opening, fixed to a free end member formed by partially cutting the frame from the opening, and arranged as a pair; and a plurality of division masks being disposed to cross the first change compensating member and the second change compensating member on top sides of the first change compensating member and the second change compensating member, being fixed to both sides of the opening to receive tension in a length direction, being fixed to the first change compensating member and the second change compensating member to receive tension in a width to direction, and forming a pattern opening.

The free end member is divided into a first cut space formed in the width direction of the division mask in the opening so as to compensate transformation of the frame formed in the length direction of the first change compensating member and the second change compensating member, and a second cut space formed in the length direction of the division mask in the first cut space.

The free end member includes a first free end member and a second free end member formed on both sides of the frame corresponding to both sides of the first change compensating member and the second change compensating member.

The first free end member and the second free end member include a third free end member and a fourth free end member respectively connected to the first change compensating member and the second change compensating member.

The third free end member and the fourth free end member share the first cut space, and are set by connecting the second cut space.

The thin-film deposition mask assembly includes a micrometer having a first terminal connected to the free end member, being installed in the frame passing over the second cut space, and controlling a gap of the second cut space.

The micrometer includes a first micrometer and a second micrometer installed in a first free end member and a second free end member formed on both sides of the frame corresponding to both sides of the first change compensating member and the second change compensating member.

The micrometer includes a third micrometer and a fourth micrometer respectively installed in a third free end member and a fourth free end member respectively connected to the first change compensating member and the second change compensating member.

The free end member includes a receiving groove for fixing both sides of the first change compensating member and the second change compensating member, and the depth of the receiving groove corresponds to the thickness of the change compensating member.

According to an embodiment, a first change compensating member and a second change compensating member are installed by providing a free end member in an opening of a frame, a division mask is fixed to the frame to apply tension in the length direction and simultaneously the same is fixed to the first and second change compensating members to apply tension in the width direction, and hence, form distortion of the division mask in the width direction is corrected even though the form of the frame is distorted by the length-directional tension of the division mask. Therefore, generation of a position error of a pattern at a pattern opening of a division mask can be prevented.

DETAILED DESCRIPTION OF THE INVENTION

The exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention.

Figure 1:
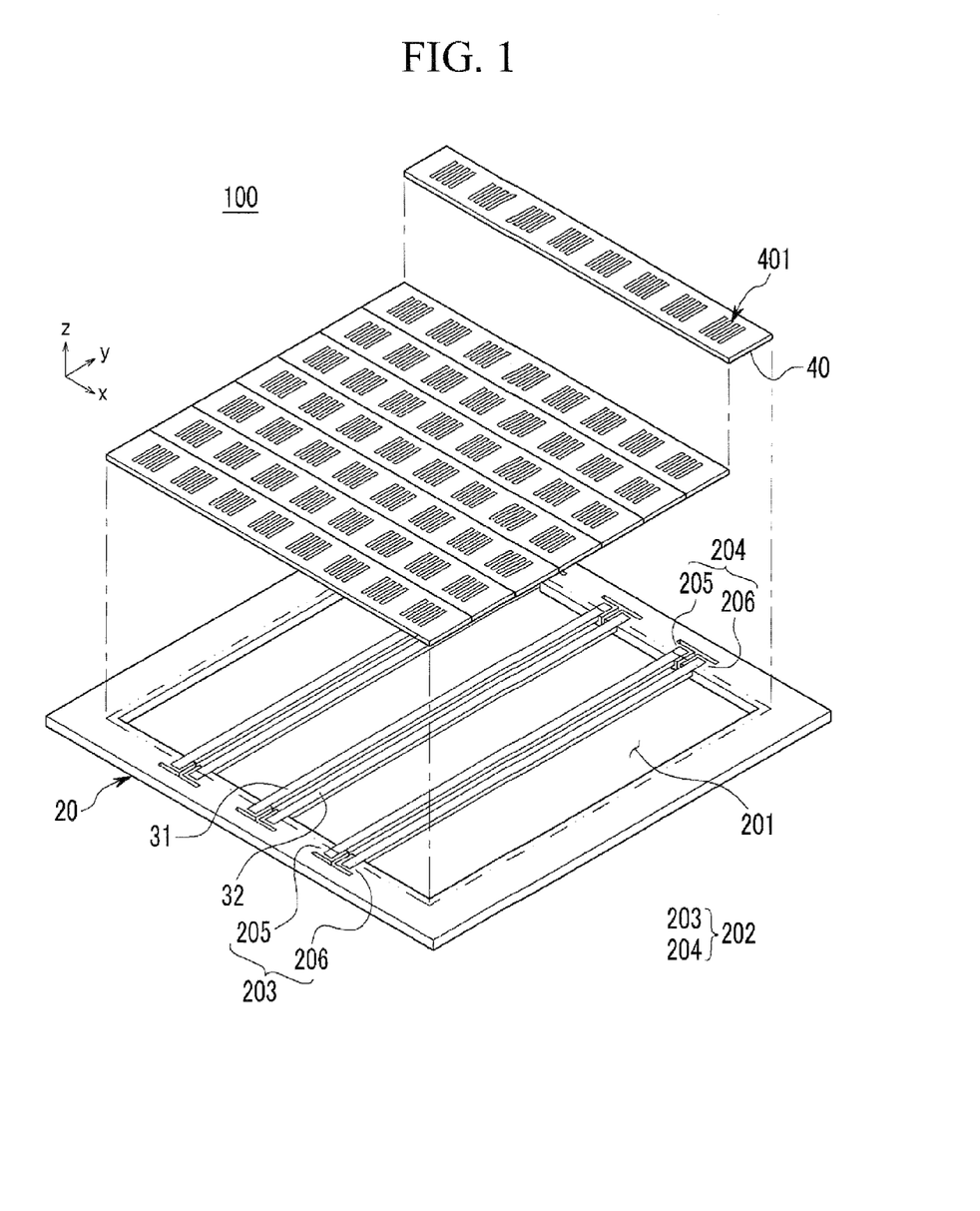
FIG. 1 shows an exploded perspective view of a thin-film deposition mask assembly of a flat panel display according to a first exemplary embodiment.
Figure 2:
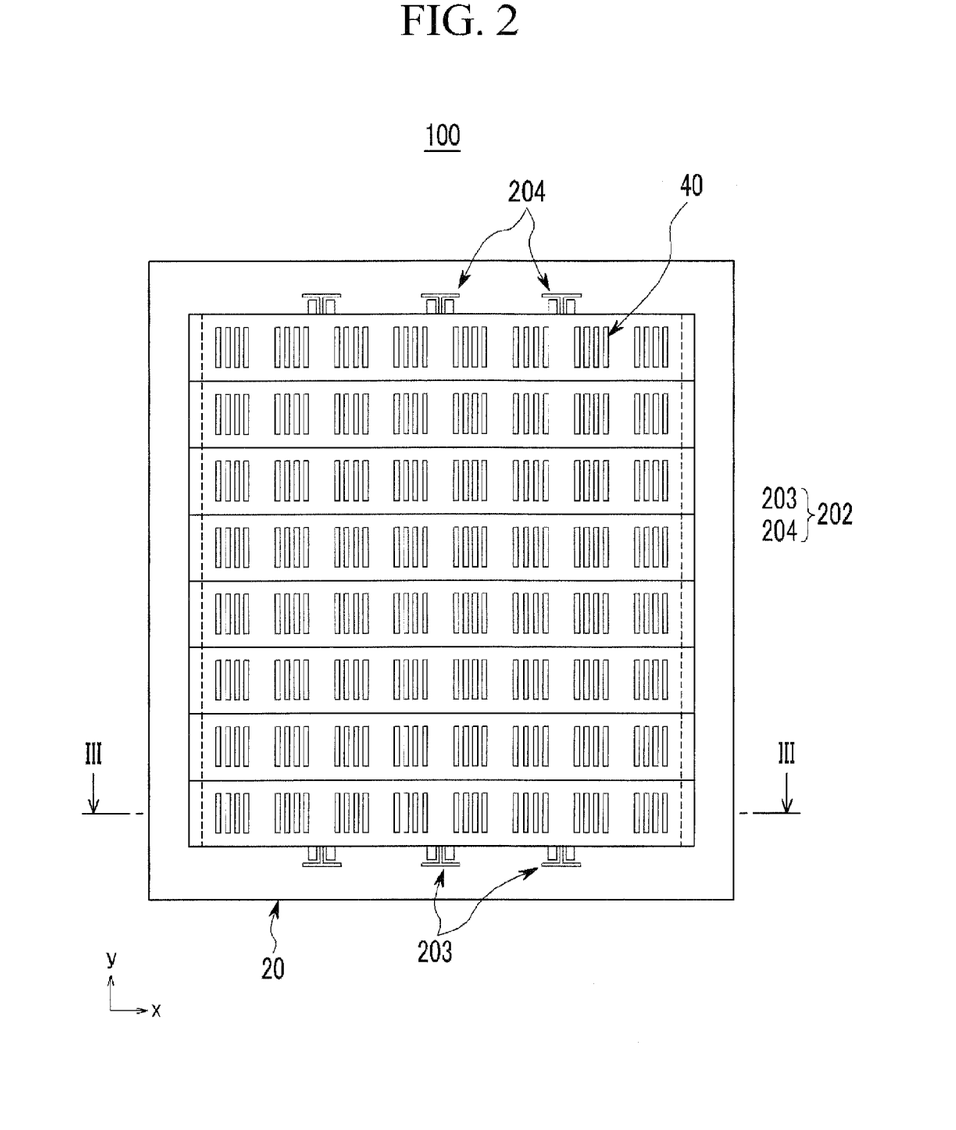
FIG. 2 shows a top plan view of a thin-film deposition mask assembly of a flat panel display shown in FIG. I.
Figure 3:
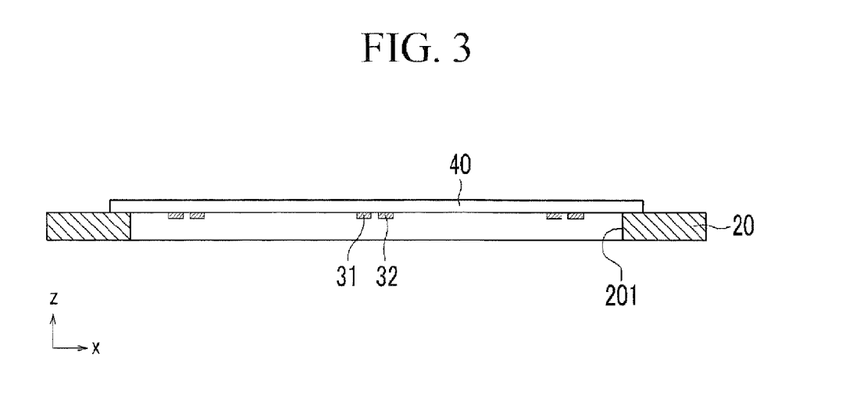
FIG. 3 shows a cross-sectional view with respect to a line III-III shown in FIG. 2.

FIG. 1 shows an exploded perspective view of a thin-film deposition mask assembly of a flat panel display according to a first exemplary embodiment, FIG. 2 shows a top plan view of a thin-film deposition mask assembly of a flat panel display shown in FIG. 1, and FIG. 3 shows a cross-sectional view with respect to a line III-III shown in FIG. 2.

Referring to FIG. 1 to FIG. 3, the thin-film deposition mask assembly 100 (for convenience, mask assembly) of a flat panel display according to the first exemplary embodiment includes a frame 20 having a penetrated opening 201, at least one pair of a first change compensating member and a second change compensating member 31 and 32 fixed to the frame 20, and a plurality of division masks 40 having a plurality of pattern openings 401 for deposition and being fixed to the frame 20 and the first and second change compensating members 31 and 32.

For example, the frame 20 is formed to be a quadrangle corresponding to a substrate array 14 (refer to FIG. 9) to be deposited, and includes a quadrangular opening 201 to be deposited on the substrate array 14. That is, the frame 20 is entirely formed to be a quadrangular frame.

The division mask 40 receives tension and is fixedly installed in the frame 20. Therefore, the frame 20 receives compressive force that is a reaction to the tension in the length direction (i.e., x-axis direction) of the division mask 40. For example, the frame 20 can be made of metallic material with great rigidity so as to minimize the change caused by the compressive force.

The first and second change compensating members 31 and 32 are fixed to the frame 20 passing through the opening 201. In the first exemplary embodiment, the first and second change compensating members 31 and 32 are disposed in parallel in the y-axis direction of the frame 20.

The first and second change compensating members 31 and 32 can include a plurality of sets that are disposed with a gap in the length-wise direction (x-axis direction) of the division mask 40 according to a size of the frame 20. By defining the one set according to the exemplary embodiment as one set, the first and second change compensating members 31 and 32 are configured with three sets and welded to the frame 20.

The division mask 40 is formed to be a belt form with the width in the y-axis direction and the length in the x-axis direction, and includes pattern openings 401 is for manufacturing a unit organic light emitting diode (OLED) display (not shown). The pattern openings 401 are disposed in the length direction (x-axis direction) of the division mask 40. The division masks 40 are repeatedly disposed in the y-axis direction to cover the entire opening 201 of the frame 20.

The division masks 40 configured for the mask assembly 100 can suppress transformation of the division mask 40 and distortion of the pattern opening 401 caused by thermal expansion that may occur during deposition, and can minimize concentration of displacement on a specific part of the division mask 40 since they receive constant tension in the length direction (x-axis direction).

The pattern opening 401 provided in the division mask 40 corresponds to one display device, and the mask assembly 100 includes a plurality of pattern openings 401 in the x-axis direction and the y-axis direction of the division mask 40. The pattern opening 401 is formed to be the same form of the electrode or emission layer to be formed on the organic light emitting diode (OLED) display.

The division mask 40 is fixed on the top surfaces of the first and second change compensating members 31 and 32, and is fixed to the frame 20 on both sides of the opening 201. In this instance, the division mask 40 receives tension in the x-axis direction and is fixed to the frame 20, and it receives tension in the y-axis direction and is fixed to the one pair of the first and second change compensating members 31 and 32.

The frame 20 includes a free end member 202 that is partially cut from the opening 201 and is then formed so as to correct y-axis directional form distortion of the division mask 40 fixed to the frame 20 even though the form of the frame is distorted in the y-axis direction because of the compressive force applied in the x-axis direction. The free end member 202 can be provided in the front or rear of the opening 201 of the frame 20, and as shown in FIG. 1, it can be provided in both the front and the rear of the opening 201 of the frame 20.

That is, the free end member 202 includes a first free end member (hereinafter, front free end member) 203 provided in the front of the frame 20 and a second free end member (hereinafter, rear free end member) 204 provided in the rear of the frame 20, opposite the front free end member 203, in correspondence to the first and second change compensating members 31 and 32. Further, the front free end member 203 and the rear free end member 204 include a third free end member (hereinafter, left free end member) 205 connected to the first change compensating member 31 and a fourth free end member (hereinafter, right free end member) 206 connected to the second change compensating member 32. The first change compensating member 31 is spot welded SP5 to the left free end member 205, and the second change compensating member 32 is spot welded SP6 to the right free end member 206 (refer to FIG. 6).

Figure 4:
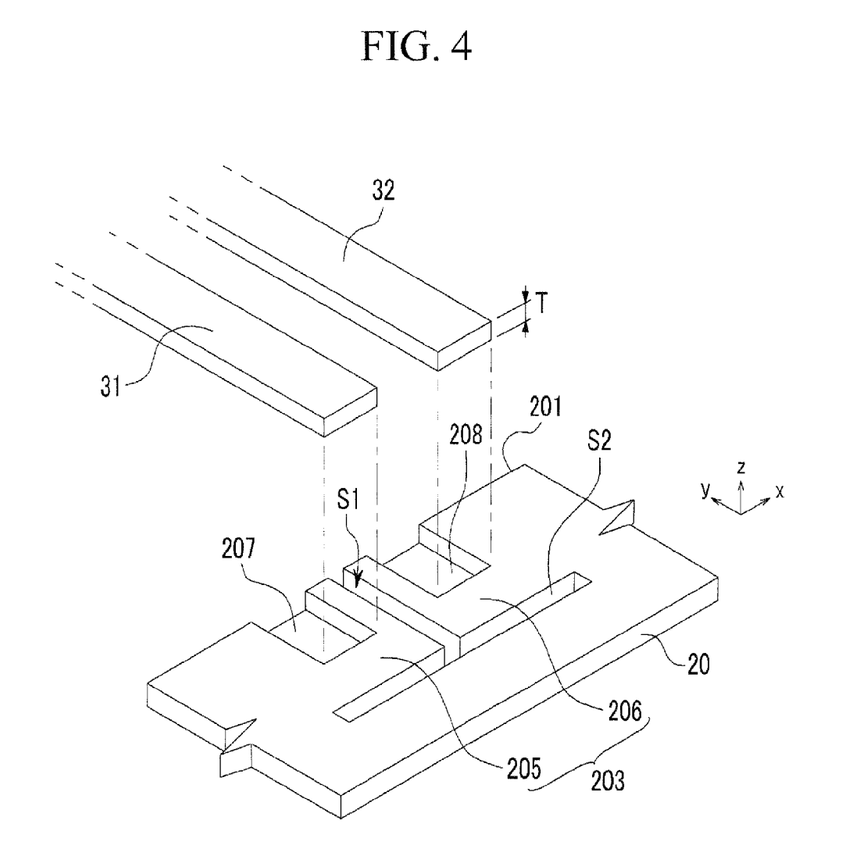
FIG. 4 shows an exploded perspective view of a part in which a first change compensating member and a second change compensating member are fixed to a mask frame.
Figure 5:
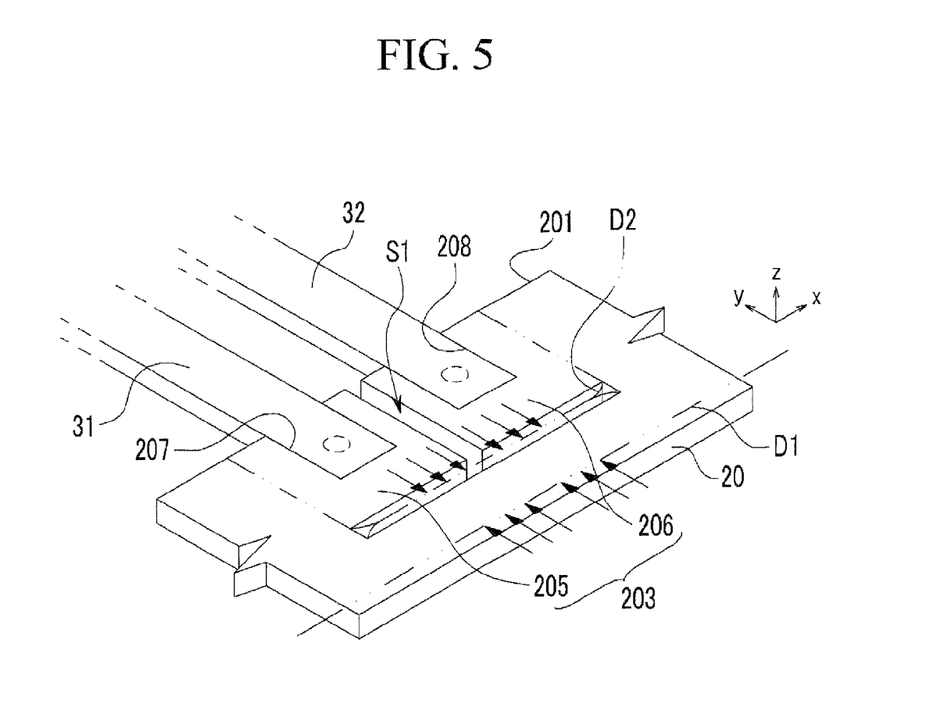
FIG. 5 shows a perspective view of a state in which a first change compensating member and a second change compensating member are welded in a mask frame.

FIG. 4 shows an exploded perspective view of a part in which a first change compensating member and a second change compensating member are fixed to a mask frame, and FIG. 5 shows a perspective view of a state in which a first change compensating member and a second change compensating member are welded in a mask frame. Referring to FIG. 4 and FIG. 5, the free end member 202 is divided into a first cut space S1 that is formed in the y-axis direction of the division mask 40 from the opening 201 and a second cut space S2 that is formed in the x-axis direction of the division mask 40 in the first cut space S1 so as to compensate transformation of the frame 20 formed in the y-axis direction of the first and second change compensating members 31 and 32. For convenience of description, the front free end member 203 will be exemplarily described.

The left free end member 205 and the right free end member 206 share the first cut space S1 provided therebetween, and have the second cut space S2 on them. The left and right free end members can be set by independently forming the first cut space and the second cut space (not shown). Also, the left free end member 205 and right free end member 206 include receiving grooves 207 and 208 for receiving both ends of the first and second change compensating members 31 and 32 and fixing them (refer to FIG. 4). The depths (H) of the receiving grooves 207 and 208 are formed to correspond to the thickness (T) of the first and second change compensating members 31 and 32. When the first and second change compensating members 31 and 32 are fixed and installed in the receiving grooves 207 and 208, top surfaces of the first and second change compensating members 31 and 32 and a top surface of the frame 20 approximately form a horizontal plane. Therefore, the division mask 40 can be installed horizontally (refer to FIG. 5).

Figure 6:
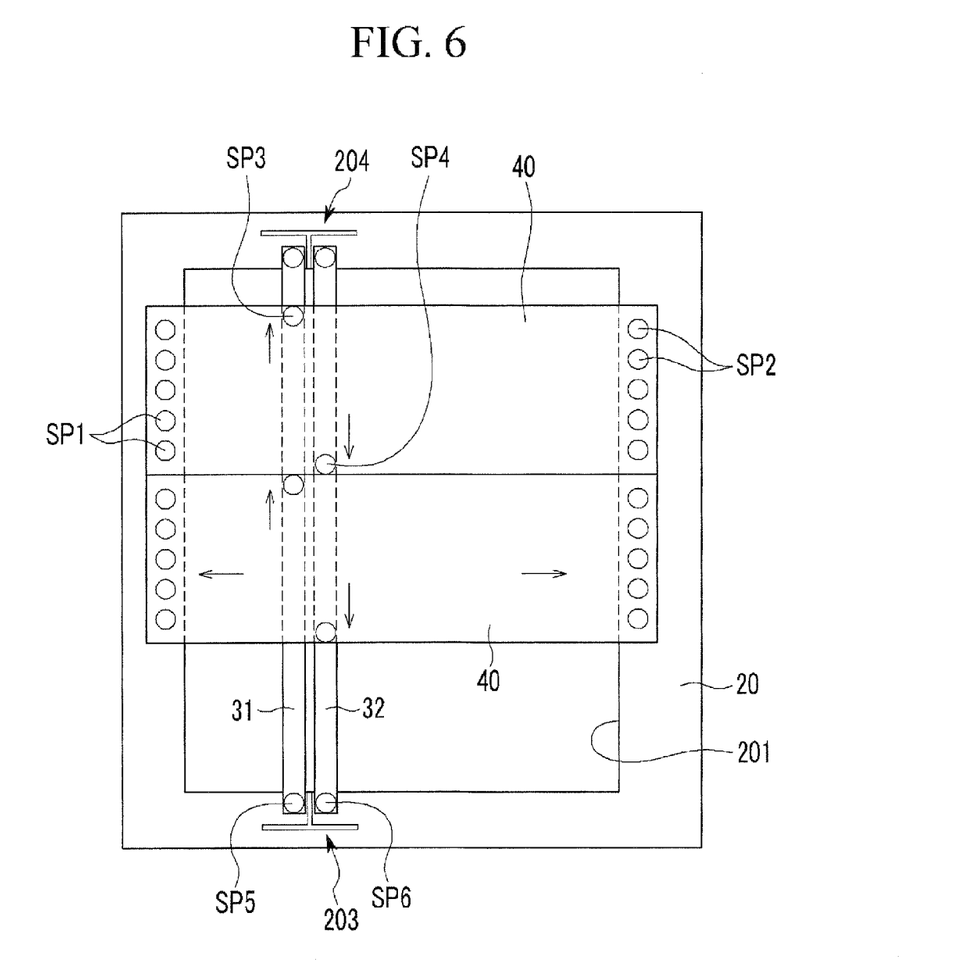
FIG. 6 shows a state diagram of a compensation operation of a first change compensating member and a second change compensating member in a mask frame.

FIG. 6 shows a state diagram of a compensation operation of a first change compensating member and a second change compensating member in a mask frame. Referring to FIG. 6, the division mask 40 receives tension in the x-axis direction and is fixed to both sides of the frame 20 through spot welding SP1 and SP2, and simultaneously receives tension in the y-axis direction and is fixed to the first and second change compensating members 31 and 32 through spot welding SP3 and SP4. In this instance, the rear part in the y-axis direction of the division mask 40 is spot welded SP3 to the first change compensating member 31 on the left, and while tension is applied in the y-axis direction, the front part is spot welded SP4 to the second change compensating member 32 on the right. Hence, the division mask 40 receives tension in the y-axis direction. The division mask 40 is fixed through welding while positioned to be overlapped with the top side of the frame 20, and it is then fixed on the top side. An outer part of the welding point of the division mask 40 is cut.

Referring to FIG. 5, when the division masks 40 receive tension in the y-axis direction and the width thereof is increased in the y-axis direction, reduction of width in the y-axis direction of the division masks 40 is compensated by form distortion Dl in the y-axis direction of the frame 20. That is, since width of the division masks 40 is transformed in the opposite direction of the distortion Dl of the frame 20, distortion of the division mask 40 in the y-axis direction is compensated (D2). In this instance, the left free end member 205 and the right free end member 206 compensate y-axis directional distortion by moving back from the solid line state to the imaginary line state D2. Therefore, a positional error of the pattern opening 401 can be reduced in the division mask 40.

Another exemplary embodiment will be described. The same configurations as the first exemplary embodiment will be omitted, and a different configuration will be described.

Figure 7:
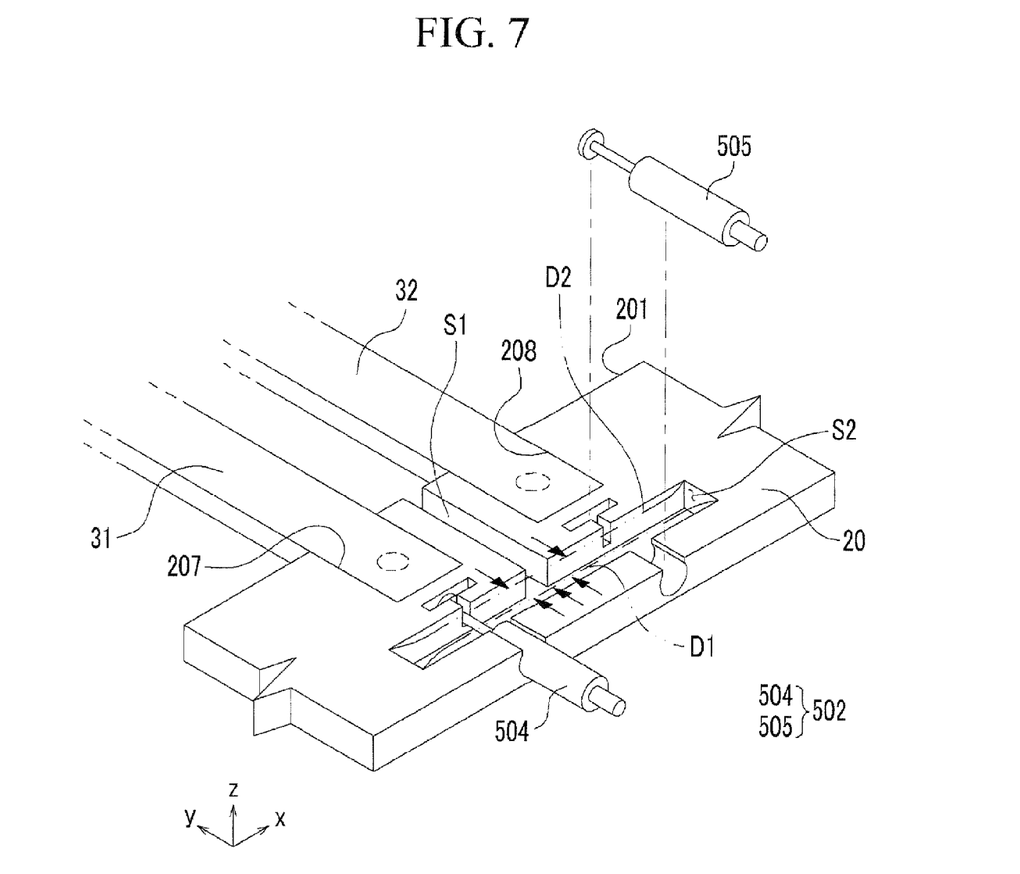
FIG. 7 shows an exploded perspective view of a part in which a first change compensating member and a second change compensating member are fixed to a mask frame in a thin-film deposition mask assembly of a flat panel display according to a second exemplary embodiment.
Figure 8:
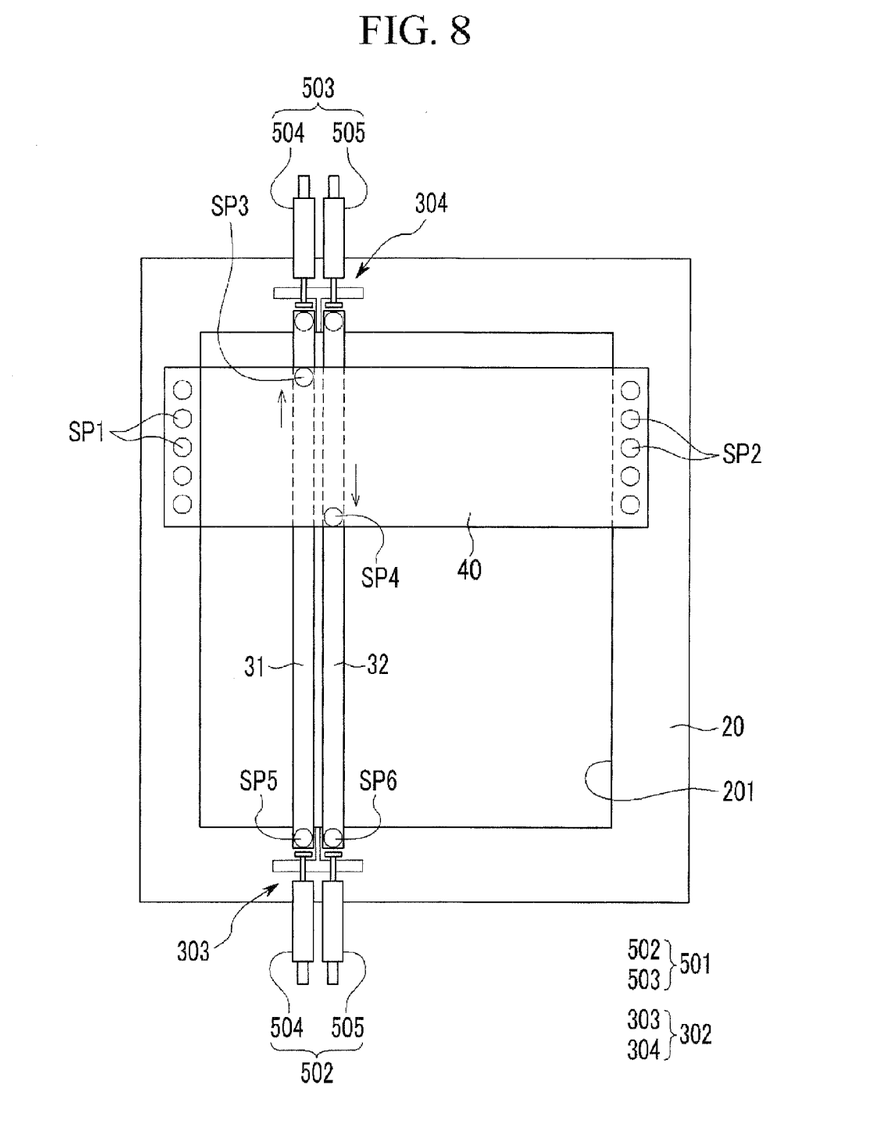
FIG. 8 shows a state diagram in which a micrometer is installed in a mask frame.

FIG. 7 shows an exploded perspective view of a part in which a first change compensating member and a second change compensating member are fixed to a mask frame in a thin-film deposition mask assembly of a flat panel display according to a second exemplary embodiment, and FIG. 8 shows a state diagram in which a micrometer is installed in a mask frame.

The first exemplary embodiment includes a free end member 202 of the frame 20 so as to fix the first and second change compensating members 31 and 32. Therefore, the first exemplary embodiment compensates y-axis directional distortion with elasticity of the free end member 202 within the range of the second cut space S2 for forming the free end member 202.

Compared to this, in the second exemplary embodiment, the free end member 302 aggressively controls the second cut space S2 to compensate for y-axis directional distortion of the free end member 302. The mask assembly 200 according to the second exemplary embodiment further includes a micrometer 501 in the free end member 302. The micrometer 501 has a first terminal connected to the free end member 302, and it is installed in the frame 20 passing over the second cut space S2 to control the gap of the second cut space S2.

The micrometer 501 includes a first micrometer (hereinafter, front micrometer) 502 and a second micrometer (hereinafter, rear micrometer) 503 installed in a front free end member 303 and a rear free end member 304 formed on both sides of the y-axis direction of the frame 20 corresponding to both sides of the first and second change compensating members 31 and 32. The front micrometer 502 and the rear micrometer 503 include a third micrometer (hereinafter, left micrometer) 504 and a fourth micrometer (hereinafter, right micrometer) 505 installed in a left free end member 305 and a right free end member 306 connected to the first and second change compensating members 31 and 32.

In the frame 20, the first and second change compensating members 31 and 32 are fixed through spot welding SP5 and SP6 to the left free end member 305 and the right free end member 306 of the front free end member 303 and rear free end member 304. Tension is applied in the x-axis direction to fix the division mask 40 to both sides of the frame 20 in the x-axis direction through spot welding SP1 and SP2, and tension is applied in the y-axis direction to fix the division mask 40 to the first and second change compensating members 31 and 32 through spot welding SP3 and SP4.

The left and right micrometers 504 and 505 installed in the left and right free end members 305 and 306 of the front and rear free end members 303 and 304 are controlled. Therefore, width of the division masks 40 is transformed in the opposite direction of distortion Dl of the frame 20 caused by tension of the division mask 40 to thus compensate the y-axis directional distortion D2 of the division mask 40. In this instance, the left free end member 305 and the right free end member 306 compensate the y-axis directional distortion D2 while moving from the solid line state to the imaginary line state.

Figure 9:
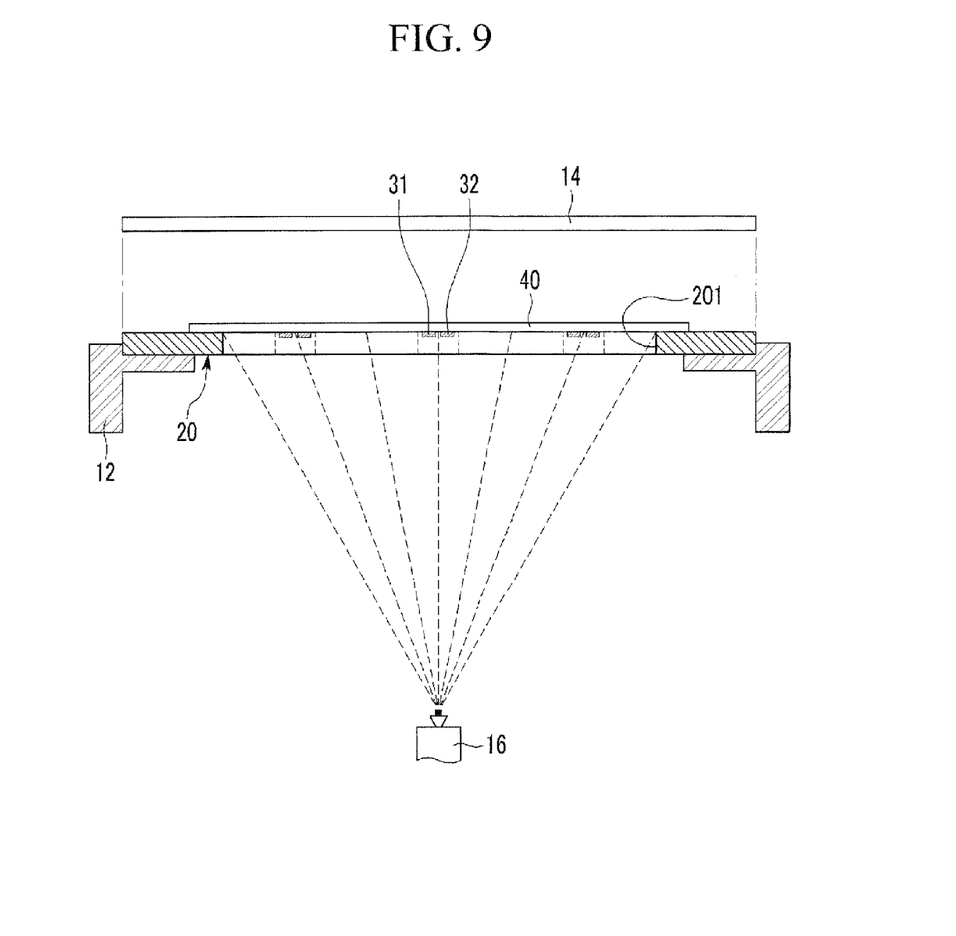
FIG. 9 shows a schematic diagram of a flat panel display deposition process using a thin-film deposition mask assembly of a flat panel display according to exemplary embodiments.

FIG. 9 shows a schematic diagram of a flat panel display deposition process using a thin-film deposition mask assembly of a flat panel display according to exemplary embodiments. Referring to FIG. 9, the mask assembly 100 is fixed to a frame holder 12 in a deposition device. A substrate array 14 is provided on the top parts of a plurality of division masks 40. When electrode material or emission layer material is vaporized from a deposition source 16, material is deposited on the substrate array 14 through the pattern opening 401 in a like form of the pattern opening 401. Therefore, a plurality of flat panel displays, for example, a plurality of organic light emitting diode (OLED) displays, can be manufactured on a single substrate array 14 by using the mask assembly 100.

The mask assembly 100 has been described in exemplary embodiments to form the electrode and the organic emission layer of an organic light emitting diode (OLED) display, and the exemplary embodiments are not restricted thereto. The mask assembly 100 is efficiently applicable to formation of electrodes of other flat panel displays.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin-film deposition mask assembly of a flat panel display, comprising:
    a frame comprising an opening;
    a first change compensating member and a second change compensating member disposed across the opening, fixed to a free end member formed by partial cut-outs of the frame from the opening, and arranged as a pair; and
    a plurality of division masks being disposed to cross the first change compensating member and the second change compensating member on top sides of the first change compensating member and the second change compensating member, said division masks being fixed to both sides of the opening to receive tension in a length direction, and said division masks being fixed to the first change compensating member and the second change compensating member to receive tension in a width direction, and forming a pattern opening;
    wherein the free end member is divided into:
    a first cut space disposed in the width direction of the division mask in the opening so as to compensate transformation of the frame formed in the length direction of the first change compensating member and the second change compensating member, and
    a second cut space disposed in the length direction of the division mask in the first cut space.

2. The thin-film deposition mask assembly of claim 1, wherein the free end member includes:
    a first free end member and a second free end member disposed on both sides of the frame corresponding to both sides of the first change compensating member and the second change compensating member.

3. The thin-film deposition mask assembly of claim 2, wherein
    the first free end member and the second free end member include a third free end member and a fourth free end member respectively connected to the first change compensating member and the second change compensating member.

4. The thin-film deposition mask assembly of claim 3, wherein
    the third free end member and the fourth free end member share the first cut space, and are set by connecting the second cut space.

5. The thin-film deposition mask assembly of claim 1, wherein the assembly includes
    a micrometer having a first terminal connected to the free end member, being disposed in the frame passing over the second cut space, and controlling a gap of the second cut space.

6. The thin-film deposition mask assembly of claim 5, wherein
    the micrometer includes a first micrometer and a second micrometer disposed in a first free end member and a second free end member disposed on both sides of the frame corresponding to both sides of the first change compensating member and the second change compensating member.

7. The thin-film deposition mask assembly of claim 6, wherein
    the micrometer includes a third micrometer and a fourth micrometer respectively disposed in a third free end member and a fourth free end member respectively connected to the first change compensating member and the second change compensating member.

8. The thin-film deposition mask assembly of claim 1, wherein
    the free end member includes a receiving groove for fixing both sides of the first change compensating member and the second change compensating member, and
    the depth of the receiving groove corresponds to the thickness of the change compensating member so that when the first and second change compensating members are disposed in the receiving grooves the top surfaces of the first and second change compensating members and the top surface of the frame approximately form a horizontal plane.

* * * * *